(12) United States Patent
Hou et al.

(10) Patent No.: US 11,751,411 B2
(45) Date of Patent: Sep. 5, 2023

(54) SOLAR CELL, MANUFACTURING METHOD THEREOF, AND PHOTOVOLTAIC MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Qiankun Hou, Zhejiang (CN); Jingsheng Jin, Zhejiang (CN); Dong Wang, Zhejiang (CN); Nannan Yang, Zhejiang (CN)

(73) Assignees: SHANGHAI JINKO GREEN ENERGY ENTERPRISE MANAGEMENT CO., LTD., Shanghai (JP); ZHEJIANG JINKO SOLAR CO., LTD., Zhejiang (JP)

( * ) Notice: Subject to any disclaimer, the term of this patent is extended or adjusted under 35 U.S.C. 154(b) by 0 days.

(21) Appl. No.: 17/412,873

(22) Filed: Aug. 26, 2021

(65) Prior Publication Data
US 2023/0041048 A1    Feb. 9, 2023

(30) Foreign Application Priority Data
Jul. 30, 2021 (CN) .......................... 202110869308.X

(51) Int. Cl.
*H10K 30/88* (2023.01)
*H10K 77/10* (2023.01)
(Continued)

(52) U.S. Cl.
CPC ............. *H10K 30/88* (2023.02); *H10K 30/20* (2023.02); *H10K 77/10* (2023.02); *H10K 85/113* (2023.02); *H10K 85/211* (2023.02); *H10K 85/30* (2023.02)

(58) Field of Classification Search
CPC .............. H01L 51/448; H01L 51/0036; H01L 51/0046; H01L 51/0077; H01L 51/0096;
(Continued)

(56) References Cited

U.S. PATENT DOCUMENTS

2011/0303904 A1* 12/2011 Avasthi ............... H01L 51/4213
                                                          257/E51.026
2012/0285521 A1   11/2012  Huang et al.
(Continued)

OTHER PUBLICATIONS

Avasthi, Crystalline-Silicon/Organic Heterojunctions for Solar Photovoltaics, A Dissertation Presented to the Faculty of Princeton University in Candidacy for the Degree, Nov. 2011 (Year: 2011).*

(Continued)

*Primary Examiner* — Devina Pillay
(74) *Attorney, Agent, or Firm* — NIXON PEABODY LLP; Jeffrey L. Costellia

(57) ABSTRACT

Provided are a solar cell, a manufacturing method thereof and a photovoltaic module. The solar cell includes a semiconductor substrate, the semiconductor substrate having a first surface and a second surface opposite to each other; a first passivation layer and a first electrode layer that are located on the first surface of the semiconductor substrate; and a second passivation layer and a second electrode layer that are located on the second surface of the semiconductor substrate. A donor material film layer is provided between the first passivation layer and the first surface of the semiconductor substrate, and/or an acceptor material film layer is provided between the second passivation layer and the second surface of the semiconductor substrate.

14 Claims, 7 Drawing Sheets

(51) Int. Cl.
*H10K 85/10* (2023.01)
*H10K 30/20* (2023.01)
*H10K 85/30* (2023.01)
*H10K 85/20* (2023.01)

(58) Field of Classification Search
CPC .............. H01L 51/424; H01L 51/4213; H01L 51/022466; H10K 30/88; H10K 30/20; H10K 77/10; H10K 85/113; H10K 85/30; H10K 85/211
See application file for complete search history.

(56) References Cited

U.S. PATENT DOCUMENTS

2016/0190375 A1* 6/2016 Chen .................... H01L 31/208 438/96
2020/0313019 A1* 10/2020 Ueyama ............ H01L 31/03762

OTHER PUBLICATIONS

Extended European Search Report for Application No. 21193699, dated Jan. 31, 2022 (14 pages).
Sushobhan Avasthi, "Crystalline-Silicon/Organic Heterojunctions for Solar Photovoltaic", Dissertation, Nov. 2011, pp. 1-242.
Chie-Sheng Liu et al., "Interface Control by Self-Assembled Monolayers in Si Heterojunction Solar Cells", Proc. Of the $24_{th}$ European Photovoltaic Solar Energy Conference, Sep. 21-25, 2009, pp. 2218-2220.
Van Hoang Nguyen, et al., "Evidence of Solute PEDOT;PSS as an efficient passivation material for fabrication hybrid c-Si solar cells", Sustainable Energy & Fuels, vol. 3, No. 6, May 28, 2019, pp. 1448-1454.
Jiun-Jie Chao et al., "GaAs nanowire/poly(3,4-ethylenedioxythiohene):poly(styrenesulfonate) hybrid solar cells with incorporating electron blocking poly (3-hexylthiophene) layer", Solar Energy Materials and Solar Cells, Elsevier Science Publishers, Amsterdam, NL, vol. 105, May 19, 2012, pp. 40-45.
Thomas H. Debesay, et al., "A Polymer Composite Based Organic FET Multi-Sensing Device", SPIE Proceedings vol. 11475, Aug. 21, 2020, pp. 114750W-1-114750W-7.

* cited by examiner

SOLAR CELL, MANUFACTURING METHOD THEREOF, AND PHOTOVOLTAIC MODULE

CROSS-REFERENCE TO RELATED APPLICATIONS

The present application claims priority to Chinese Patent Application No. 202110869308.X, filed on Jul. 30, 2021, the content of which is incorporated herein by reference in its entirety.

TECHNICAL FIELD

The present disclosure relates to the field of photovoltaic cell technologies, and in particular, to a solar cell, a manufacturing method thereof and a photovoltaic module.

BACKGROUND

In an existing solar cell, passivation layers are respectively arranged on front and rear surfaces of a semiconductor substrate. During use of the solar cell, a silicon epitaxial growth phenomenon may easily occur between a crystalline silicon interface of the semiconductor substrate and an amorphous silicon interface of the passivation layer. A silicon epitaxial growth layer may easily cause carrier recombination and electrical performance loss, which brings a negative impact on passivation effect and conversion efficiency of the solar cell.

Therefore, it is desirable to develop a solar cell which can inhibit silicon epitaxial growth and also improve the conversion efficiency of the solar cell.

SUMMARY

In view of the above, the present disclosure provides a solar cell, a manufacturing method thereof and a photovoltaic module, which can reduce silicon epitaxial growth between a crystalline silicon interface and an amorphous silicon interface of the solar cell, so as to improve parallel resistance and a fill factor of the solar cell and improve conversion efficiency of the solar cell.

In a first aspect, the present disclosure provides a solar cell. The solar cell includes a semiconductor substrate including:

a first surface and a second surface opposite to each other;

a semiconductor substrate having a first surface and a second surface opposite to the first surface;

a first passivation layer and a first electrode layer that are located on the first surface of the semiconductor substrate; and a second passivation layer and a second electrode layer that are located on the second surface of the semiconductor substrate, wherein a donor material film layer is provided between the first passivation layer and the first surface of the semiconductor substrate, and/or an acceptor material film layer is provided between the second passivation layer and the second surface of the semiconductor substrate.

In an embodiment, an acceptor material of the acceptor material film layer has an electron mobility of $1\ cm^2V^{-1}S^{-1}$ to $50\ cm^2V^{-1}S^{-1}$, a LUMO energy level of $-2.8\ eV$ to $-3.6\ eV$, a HOMO energy level of $-5.2\ eV$ to $-5.6\ eV$, and an optical band gap of $1.7\ eV$ to $4\ eV$.

In an embodiment, a donor material of the donor material film layer has a hole mobility of $1\times10^{-6}\ cm^2V^{-1}S^{-1}$ to $1\times10^{-2}\ cm^2V^{-1}S^{-1}$, a LUMO energy level of $-3.2\ eV$ to $-3.6$ eV, a HOMO energy level of $-5.2\ eV$ to $-6.4\ eV$, and an optical band gap of $1.7\ eV$ to $4\ eV$.

In an embodiment, the acceptor material film layer includes an organic acceptor material with electron transport capability, the organic acceptor material including at least one of a fullerene-based acceptor material and a non-fullerene-based acceptor material.

In an embodiment, the donor material film layer includes at least one of a polythiophene material with hole transport capability, a fluorene-containing polymer material, a small-molecule photovoltaic material containing a benzodithiophene electron donor element and a small-molecule photovoltaic material containing a porphyrin unit.

In an embodiment, the donor material film layer has a thickness of 1 nm to 20 nm, and/or the acceptor material film layer has a thickness of 1 nm to 20 nm.

In an embodiment, the semiconductor substrate includes a monocrystalline silicon substrate or a silicon carbide substrate.

In an embodiment, the semiconductor substrate is an N-type semiconductor substrate, and the donor material film layer is arranged between a first surface of the N-type semiconductor substrate and the first passivation layer; or the semiconductor substrate is a P-type semiconductor substrate, and the acceptor material film layer is arranged between a first surface of the P-type semiconductor substrate and the first passivation layer.

In an embodiment, the first passivation layer includes an amorphous passivation material or a microcrystalline passivation material with doping elements of a same conductivity type as in the semiconductor substrate.

In an embodiment, the semiconductor substrate is an N-type semiconductor substrate, and the first passivation layer includes an N-type doped amorphous silicon material or microcrystalline silicon material; or the semiconductor substrate is a P-type semiconductor substrate, and the first passivation layer includes a P-type doped amorphous silicon material or microcrystalline silicon material.

In an embodiment, the second passivation layer includes an amorphous passivation material or a microcrystalline passivation material with doping elements of an opposite conductivity type as in the semiconductor substrate.

In an embodiment, the semiconductor substrate is an N-type semiconductor substrate, and the second passivation layer includes a P-type doped amorphous silicon material or microcrystalline silicon material; or the semiconductor substrate is a P-type semiconductor substrate, and the second passivation layer includes an N-type doped amorphous silicon material or microcrystalline silicon material.

In an embodiment, the first electrode layer or the second electrode layer includes a transparent conductive electrode material.

In a second aspect, an embodiment of the present disclosure provides a method for manufacturing a solar cell, including:

providing a semiconductor substrate;

forming a donor material film layer on a first surface of the semiconductor substrate; and forming a first passivation layer on a surface of the donor material film layer, and forming a first electrode layer on a surface of the first passivation layer; and/or forming an acceptor material film layer on a second surface of the semiconductor substrate; and forming a second passivation layer on a surface of the acceptor material film layer, and forming a second electrode layer on a surface of the second passivation layer.

In an embodiment, the acceptor material includes at least one of: a. at least one of an organic acceptor material and an inorganic acceptor material with electron transport capability; b. at least one of an organic acceptor material and an inorganic acceptor material with electron transport capability, the organic acceptor material including at least one of a fullerene-based acceptor material and a non-fullerene-based acceptor material; and c. at least one of an organic acceptor material and an inorganic acceptor material with electron transport capability, the inorganic acceptor material including at least one of graphene, cadmium antimonide and zinc oxide.

In an embodiment, the donor material includes at least one of a polythiophene material having hole transport capability, a fluorene-containing polymer material, a small-molecule photovoltaic material containing a benzodithiophene electron donor element and a small-molecule photovoltaic material containing a porphyrin unit.

In an embodiment, the donor material film layer and/or the acceptor material film layer is manufactured by: dissolving the donor material in a first solvent, and then coating the first surface of the semiconductor substrate with the donor material by any one of pulling, spin coating, blade coating, printing and evaporation deposition, the donor material being dissolved in the first solvent to form a solution with a concentration of 1 mg/mL to 50 mg/mL; and/or dissolving the acceptor material in a second solvent, and then coating the second surface of the semiconductor substrate with the acceptor material by any one of pulling, spin coating, blade coating, printing and evaporation deposition and/or the acceptor material being dissolved in the second solvent to form a solution with a concentration of 1 mg/mL to 50 mg/mL; wherein the first solvent and/or the second solvent being any one of chloroform, methanol, ethanol, acetone, dichloromethane and ethyl acetate.

In an embodiment, the forming a first passivation layer on a surface of the donor material film layer and/or the step of forming a second passivation layer on a surface of the acceptor material film layer includes: depositing at least one of amorphous silicon carbide, amorphous silicon oxide, amorphous silicon nitride and amorphous silicon germanium on the surface of the donor material film layer to obtain the first passivation layer by first annealing treatment; and/or depositing at least one of amorphous silicon carbide, amorphous silicon oxide, amorphous silicon nitride and amorphous silicon germanium on the surface of the acceptor material film layer to obtain the second passivation layer by second annealing treatment; wherein the first annealing treatment and/or the second annealing treatment is performed at a temperature of 80° C. to 120° C. with an annealing treatment time of 5 min to 10 min.

In a third aspect, an embodiment of the present disclosure provides a photovoltaic module including a plurality of solar cell strings, each of the solar cell strings includes the solar cells described in the first aspect or solar cells manufactured by the method described in the second aspect.

BRIEF DESCRIPTION OF DRAWINGS

In order to better illustrate the technical solutions in embodiments of the present disclosure or the related art, the accompanying drawings used in the description of the embodiments or the related art will be introduced below. It is apparent that, the accompanying drawings in the following description only show some embodiments of the present disclosure, and other drawings can be obtained by those of ordinary skill in the art from the provided drawings without creative efforts.

DESCRIPTION OF EMBODIMENTS

In order to better understand the technical solutions of the present disclosure, embodiments of the present disclosure are described in detail below with reference to the accompanying drawings.

It should be made clear that the embodiments described are only some of rather than all of the embodiments of the present disclosure. All other embodiments acquired by those of ordinary skill in the art without creative efforts based on the embodiments of the present disclosure shall fall within the protection scope of the present disclosure.

The terms used in the embodiments of the present disclosure are intended only to describe particular embodiments and are not intended to limit the present disclosure. As used in the embodiments of the present disclosure and the appended claims, the singular forms "a/an", "the", and "said" are intended to include plural forms as well, unless otherwise clearly specified by the context.

It should be understood that the term "and/or" used herein describes only an association relationship between associated objects and indicates that three relationships may exist. For example, A and/or B may indicate the following three cases: only A exists, both A and B exist, and only B exists. Further, the character "/" herein generally indicates an "or" relationship between the associated objects.

In addition, the terms "first" and "second" are used for descriptive purposes only, which shall not be construed as indicating or implying a relative importance, or implicitly specifying the number of the indicated technical features. Thus, the features defined with "first" and "second" may explicitly or implicitly include one or more features.

Front and rear surfaces of an existing solar cell structure are sequentially a substrate, a passivation layer and an electrode from the inside out, respectively. Due to the contact between the semiconductor substrate and the passivation layer, silicon epitaxial growth may easily occur between a crystalline silicon interface of the semiconductor substrate and an amorphous silicon interface of the passivation layer, resulting in an undesired passivation effect of the solar cell.

Therefore, in order to overcome the imperfection of the related art, the technical solutions of the embodiments of the present disclosure provide a solar cell, a manufacturing method thereof and a photovoltaic module, in which a donor material film layer or an acceptor material film layer is manufactured between a semiconductor structure and an amorphous silicon interface, so as to inhibit silicon epitaxial growth, improve the passivation effect of the solar cell, improve parallel resistance and a fill factor of the solar cell, and improve conversion efficiency of the solar cell.

Figure 1:
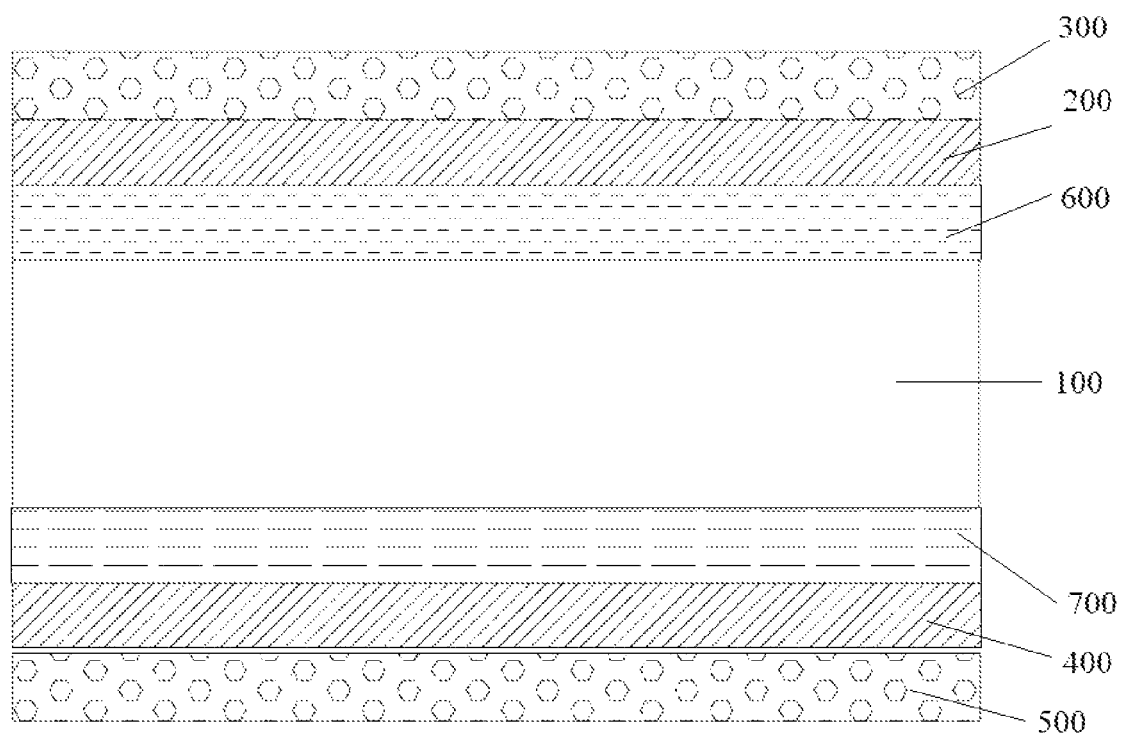
FIG. 1 is a first schematic structural diagram of a solar cell according to an embodiment of the present disclosure.

In a first aspect, an embodiment of the present disclosure provides a solar cell. FIG. 1 is a first schematic structural diagram of a solar cell according to the present disclosure. The solar cell includes a semiconductor substrate 100 having a first surface and a second surface opposite to the first surface; a first passivation layer 200 and a first electrode layer 300 that are located on the first surface of the semiconductor substrate 100; and a second passivation layer 400 and a second electrode layer 500 that are located on the second surface of the semiconductor substrate 100. A donor material film layer 600 is provided between the first passivation layer 200 and the first surface of the semiconductor substrate 100, and an acceptor material film layer 700 is provided between the second passivation layer 400 and the second surface of the semiconductor substrate 100.

In the above technical solution, the donor material film layer 600 is formed between the semiconductor substrate 100 and the first passivation layer 200, and the acceptor material film layer 700 is formed between the second passivation layer 400 and the second surface of the semiconductor substrate 100. The existence of the donor material film layer 600 and/or the acceptor material film layer 700 can prevent contact between the semiconductor substrate 100 and the passivation layer and inhibit silicon epitaxial growth, so as to improve the passivation effect. In addition, the donor material film layer and the acceptor material film layer provided in the present disclosure are made of materials having high light transmittance and small optical parasitic absorption, which can improve the conversion efficiency of the solar cell.

In some embodiments, the first surface of the semiconductor substrate 100 may refer to a front surface or a rear surface of the semiconductor substrate 100, and the second surface of the semiconductor substrate 100 may refer to the rear surface or front surface of the semiconductor substrate 100 opposite to the first surface. As used herein, the front surface of the semiconductor substrate 100 is a light receiving surface facing the sun, and the rear surface is a surface facing away from the sun. When the first surface is the front surface of the semiconductor substrate 100, the second surface is the rear surface of the semiconductor substrate 100.

In some embodiments, the donor material film layer 600 or the acceptor material film layer 700 may be arranged on the front surface of the semiconductor substrate 100 alone, or the donor material film layer 600 or the acceptor material film layer 700 may be arranged on the rear surface of the semiconductor substrate 100 alone, or the material film layers can be arranged on the front and back surfaces of the semiconductor substrate 100 at the same time. When the material film layers are arranged on the front and rear surfaces of the semiconductor substrate 100 at the same time, materials on the front and rear surfaces may be different types. That is, if an emitter is located on the front surface of the semiconductor substrate, the donor material film layer 600 is arranged on the front surface of the semiconductor substrate, and the acceptor material film layer 700 is arranged on the rear surface of the semiconductor substrate 100. If the emitter is located on the rear surface of the semiconductor substrate 100, the donor material film layer 600 is arranged on the rear surface of the semiconductor substrate 100, and the acceptor material film layer 700 is arranged on the front surface of the semiconductor substrate 100.

In some embodiments, the donor material film layer 600 includes at least one of a polythiophene material with hole transport capability, a fluorene-containing polymer material, a small-molecule photovoltaic material containing a benzodithiophene electron donor element and a small-molecule photovoltaic material containing a porphyrin unit. The above materials may be a polythiophene material system [poly(3-hexyl thiophene), poly(3-octylthiophene)], fluoren-containing polymer materials [(PF8BT), (PFDTBT1)], small-molecule photovoltaic materials [(DR3TSBDT), (BTID-1F)] containing benzodithiophene electron donor elements, small-molecule materials [(PTTR), (PTTCNR)] containing porphyrin units, and the like.

The donor material used in the present disclosure may be provided from rich raw material, which has high light transmittance and small optical parasitic absorption, and a low temperature requirement for annealing crystallization, which can prevent the contact between the crystalline silicon interface and the amorphous silicon interface and inhibit silicon epitaxial growth to effectively improve the passivation effect, and also enhance the light absorption and improve the photoelectric conversion efficiency of the solar cell. In addition, the manufacturing process of the donor material film layer according to the present disclosure is simple, and can be completed by coating, which does not need expensive equipment, thereby effectively saving costs.

The donor material has a higher highest occupied molecular orbital (HOMO) energy level and a lower lowest unoccupied molecular orbital (LUMO) energy level. In some embodiments, an organic donor material has a LUMO energy level of −3.2 eV to −3.6 eV, a HOMO energy level of −5.2 eV to −6.4 eV, and an optical band gap of 1.7 eV to 4 eV. The LUMO energy level matches well with the semiconductor substrate 100, and a monocrystalline silicon substrate has an electron affinity of 4.05 eV and a stop band of 1.12 eV. Therefore, the film layer made of the donor material can facilitate the transport of holes from the semiconductor substrate to the donor material film layer. Moreover, the donor material selected herein has a larger optical bandwidth (generally greater than 2), for example, a polymer of 3-hexylthiophene (P3HT), which has a HOMO of about −5.25 eV, a LUMO of about −2.85 eV and an optical band gap of 2.4 eV. The manufactured donor material film layer has higher light transmittance and smaller optical parasitic absorption, which can reduce a decrease in photoelectric conversion of the solar cell caused by the coating of the film layer.

In some embodiments, the acceptor material film layer 700 includes at least one of an organic acceptor material and an inorganic acceptor material with electron transport capability. The organic acceptor material includes at least one of a fullerene-based acceptor material and a non-fullerene-based acceptor material. For example, the organic acceptor material may be perylene diimides, benzothiazoles, diketopyrrolopyrroles and the like. The perylene diimides may be, for example, N, N-dibenzimidazole-3,4,9,10-perylene tetracarboxylic diimide, which can absorb light in a visible region (400 nm to 600 nm) and have a high electron mobility ($10^{-3}$ $cm^2V^{-1}S^{-1}$ to $10^{-1}$ $cm^2V^{-1}S^{-1}$). The benzothiazoles may be, for example, benzothiazole-based acceptor materials with a phenyl group of F atoms, and may be TFPVDPP, F3PDPP, DFPDPP and the like. Its unique H electron aromatic nuclei have higher electron transport performance. The diketopyrrolopyrroles may be, for example, small-molecule acceptor materials with spirofluorene (SF) as a nucleus and fluorobenzene (FB) capped diketopyrrolopyrrole (DPP) as an arm. The above acceptor materials have good photochemical stability, a high molar extinction coefficient, a good conjugate structure, a narrow energy level band gap and strong electron affinity, which can improve the photoelectric conversion efficiency of the solar cell. The inorganic acceptor material includes at least one of graphene, cadmium antimonide and zinc oxide. The organic and inorganic materials can be used alone or in combination, which is not limited in the present disclosure.

The acceptor material used in the present disclosure may be provided from rich raw material, which has high light transmittance and small optical parasitic absorption, and a low temperature requirement for annealing crystallization, which can prevent the contact between the crystalline silicon interface and the amorphous silicon interface and inhibit silicon epitaxial growth, so as to effectively improve the passivation effect, and also enhance the light absorption and improve the photoelectric conversion efficiency of the solar cell. In addition, the manufacturing process of the acceptor material film layer according to the present disclosure is simple, and can be completed by coating, which does not need expensive equipment, thereby effectively saving costs. In addition, the acceptor material used in the present disclosure has a lower lowest unoccupied molecular orbital (LUMO) energy level. The LUMO energy level of the acceptor material is generally 0.3 eV to 0.5 eV lower than that of the donor material. In some embodiments, the acceptor material has a LUMO energy level of −2.8 eV to −3.6 eV, a HOMO energy level of −5.2 eV to −5.6 eV and an optical band gap of 1.7 eV to 4 eV, which has strong electron affinity, so that the acceptor material has good electron transport capability, and when coating the surface of the semiconductor substrate to form a film layer, it facilitates the transport of electrons from the semiconductor substrate to the acceptor material film layer. Moreover, the acceptor material selected in the present disclosure has a larger optical bandwidth (generally greater than 2), for example, a fullerene derivative (PCBM), which has a HOMO of about −3.70 eV, a LUMO of about −6.18 eV and an optical band gap of 2.4 eV. The manufactured donor material film layer has higher light transmittance and smaller optical parasitic absorption, which can reduce a decrease in photoelectric conversion of the solar cell caused by the coating of the film layer.

When the film layers (i.e., the acceptor material film layer and the donor material film layer) are arranged on the first surface and the second surface of the semiconductor substrate 100 at the same time, silicon epitaxial growth on the front and rear surfaces of the semiconductor substrate 100 is inhibited at the same time, the passivation effect is strengthened, the light absorption is enhanced, and the conversion efficiency of the solar cell is greatly improved.

In addition, the electron mobility of the acceptor material is greater than that of the donor material, and the hole transport capability of the donor material is greater than that of the acceptor material. In some embodiments, the organic acceptor material has an electron mobility of 1 $cm^2V^{-1}S^{-1}$ to 50 $cm^2V^{-1}S^{-1}$, and the donor material has a hole mobility of $1\times10^{-6}$ $cm^2V^{-1}S^{-1}$ to $1\times10^{-2}$ $cm^2V^{-1}S^{-1}$. In some embodiments, the donor material film layer 600 has a thickness of 1 nm to 20 nm, which may be 1 nm, 3 nm, 5 nm, 7 nm, 10 nm, 13 nm, 15 nm, 20 nm and so on. The acceptor material film layer 700 has a thickness of 1 nm to 20 nm, which may be 1 nm, 3 nm, 5 nm, 7 nm, 10 nm, 13 nm, 15 nm, 20 nm and so on. If the thickness is too small, an effect of inhibiting silicon epitaxy is not good; if the thickness is too large, carrier transport capability of the solar cell may deteriorate, and then the efficiency of the solar cell may decrease.

The thickness of the donor material film layer 600 matches the thickness of the first passivation layer 200, and the thickness of the acceptor material film layer 700 matches the thickness of the second passivation layer 400, so as to improve the conversion efficiency of the solar cell. In some embodiments, the semiconductor substrate 100 includes a monocrystalline silicon substrate or a silicon carbide substrate. For example, the donor material film layer and the acceptor material film layer in the present disclosure is applicable to a crystalline silicon substrate, and also to solar cells with an amorphous silicon substrate, provided that the substrate is made of a material in line with optical and electrical characteristics of a solar cell absorption layer.

In some embodiments, the semiconductor substrate 100 according to the present disclosure may be an N-type semiconductor substrate or a P-type semiconductor substrate. For example, an N-type semiconductor substrate may be made by using phosphorus as a doping element in the semiconductor substrate. In another example, a P-type semiconductor substrate may be made by using boron as a doping element in the semiconductor substrate. In some embodiments, If the substrate is an N-type semiconductor substrate, an emitter of the N-type semiconductor substrate is located on the first surface, a donor material film layer is arranged between the N-type semiconductor substrate and the first passivation layer, which facilitates transport of holes from the N-type semiconductor substrate to the first passivation layer. Likewise, if the substrate is a P-type semiconductor substrate, an emitter of the P-type semiconductor substrate is located on the first surface, an acceptor material film layer is arranged between the P-type semiconductor substrate and the first passivation layer, which facilitates transport of holes from the P-type semiconductor substrate to the first passivation layer.

Figure 2:
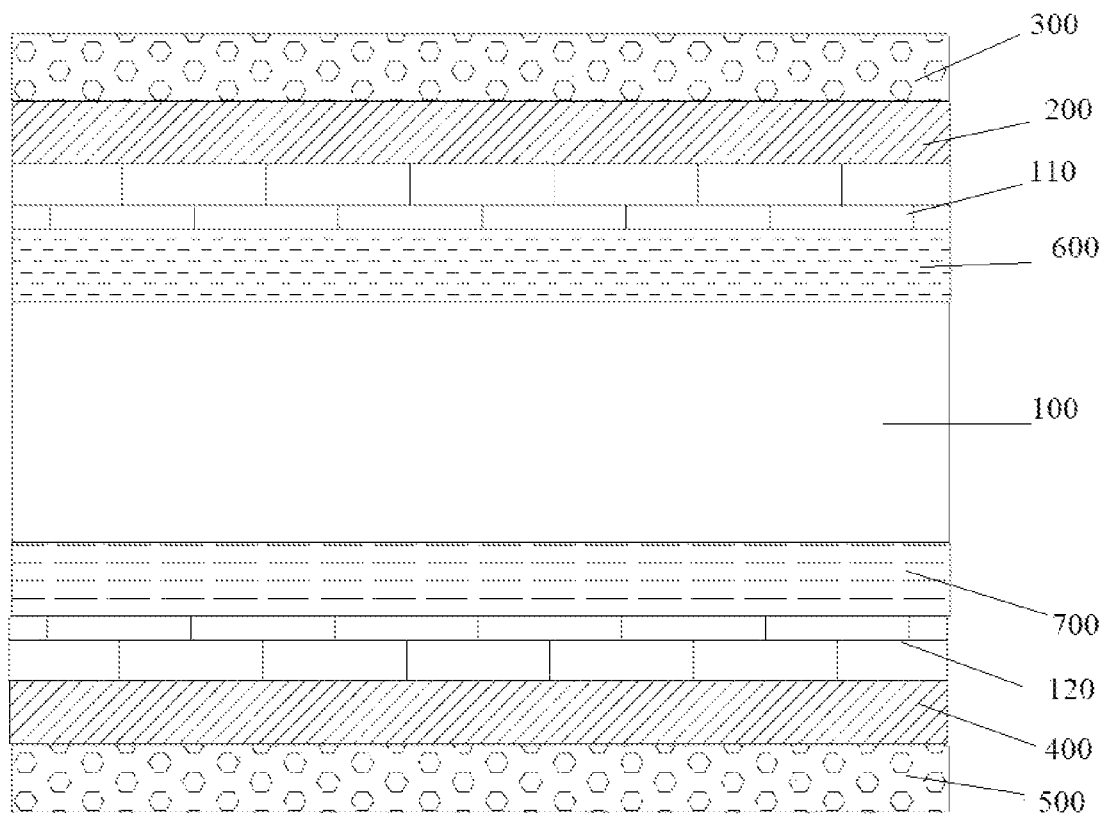
FIG. 2 is a second schematic structural diagram of the solar cell according to an embodiment of the present disclosure.

In some embodiments, the first passivation layer 200 includes an amorphous passivation material or a microcrystalline passivation material with doping elements of a same conductivity type as that in the semiconductor substrate 100. The above amorphous passivation material or microcrystalline passivation material of the first passivation layer 200 includes at least one of amorphous/microcrystalline silicon carbide, amorphous/microcrystalline silicon oxide, amorphous/microcrystalline silicon nitride and amorphous/microcrystalline silicon germanide. An obtained structure of the solar cell is shown in FIG. 2. The second passivation layer 400 includes an amorphous passivation material or a microcrystalline passivation material with doping elements of an opposite conductivity type to that in the semiconductor substrate 100. The above amorphous passivation material or microcrystalline passivation material of the second passivation layer 400 includes at least one of amorphous/microcrystalline silicon carbide, amorphous/microcrystalline silicon oxide, amorphous/microcrystalline silicon nitride and amorphous/microcrystalline silicon germanide. It is appreciated that, when the semiconductor substrate 100 is an N-type semiconductor substrate, the first passivation layer 200 includes an N-type doped amorphous silicon material or microcrystalline silicon material, and the second passivation layer 400 includes a P-type doped amorphous silicon material or microcrystalline silicon material. When the semiconductor substrate 100 is a P-type semiconductor substrate, the first passivation layer 200 includes a P-type doped amorphous silicon material or microcrystalline silicon material, and the second passivation layer 400 includes an N-type doped amorphous silicon material or microcrystalline silicon material. In the present disclosure, the amorphous passivation material or microcrystalline passivation material with doping elements of the same conductivity type as that in the semiconductor substrate 100 is selected for the first passivation layer 200. The amorphous passivation material or microcrystalline passivation material may form a tunneling emission junction (PN junction) with the semiconductor substrate 100 to enhance electron transport and improve the performance of the solar cell. The amorphous passivation material or microcrystalline passivation material with doping elements of the opposite conductivity type as to that in the semiconductor substrate 100 is selected for the second passivation layer 400. The amorphous passivation material or microcrystalline passivation material forms a surface electric field on the surface of the semiconductor substrate 100 to reduce carrier recombination, so as to improve the conversion efficiency of the solar cell.

Figure 3:
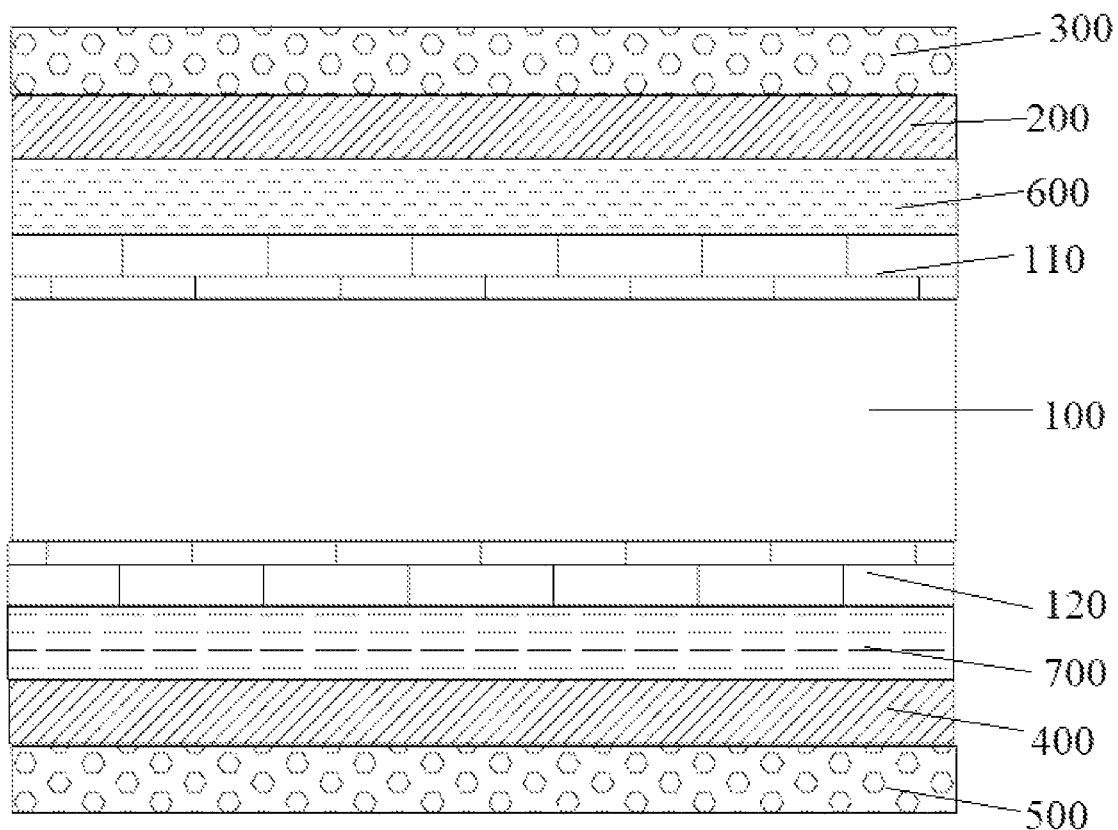
FIG. 3 is a third schematic structural diagram of the solar cell according to an embodiment of the present disclosure.

As shown in FIG. 3, the amorphous passivation material or microcrystalline passivation material may also be arranged between the semiconductor substrate 100 and the donor material film layer 600 or between the semiconductor substrate 100 and the acceptor material film layer 700.

In some embodiments, the first electrode layer 300 and/or the second electrode layer 500 include/includes a transparent conductive electrode material. The manufactured solar cell is a heterojunction (HJT) cell, and the transparent conductive material can reduce series resistance of the heterojunction cell during current collection, and can also reduce reflection.

Figure 4:
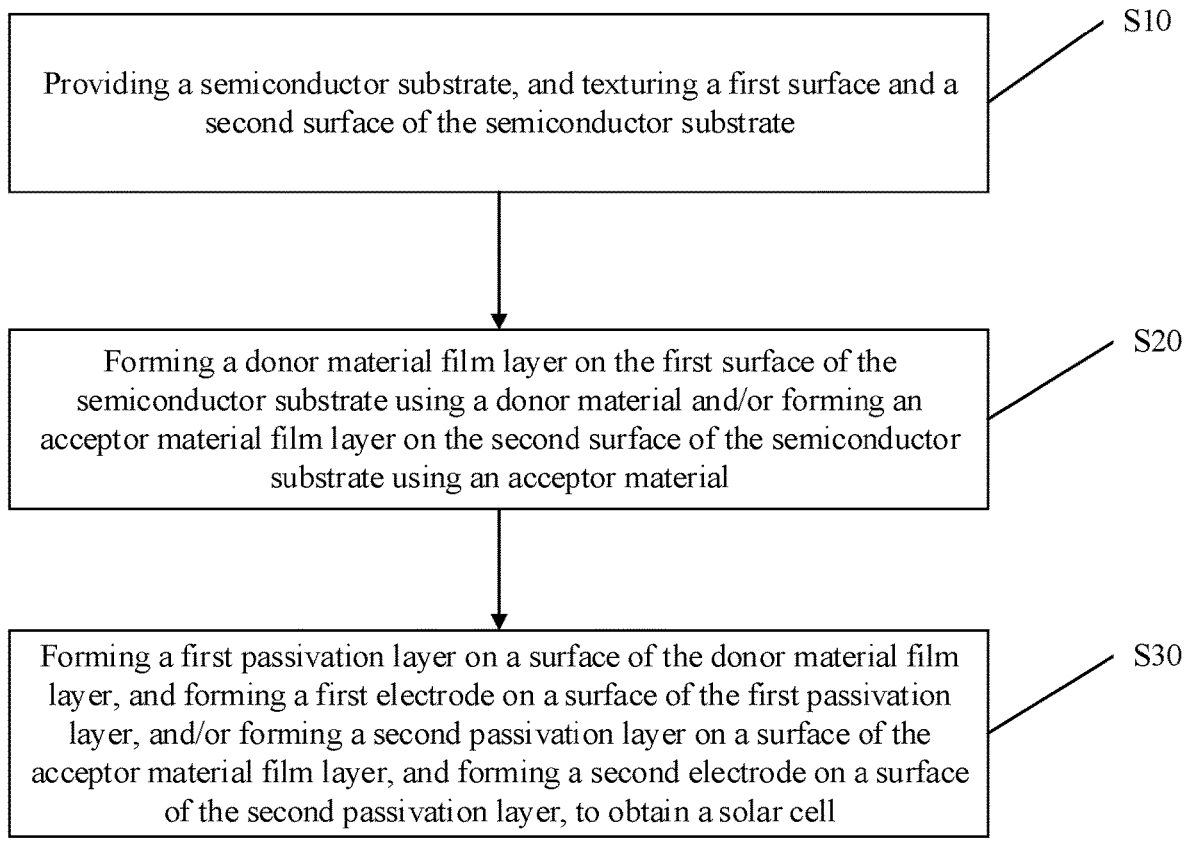
FIG. 4 is a flowchart of a manufacturing method of the solar cell according to an embodiment of the present disclosure.

In a second aspect, an embodiment of the present disclosure provides a method for manufacturing a solar cell. FIG. 4 is a flowchart of a method for manufacturing a solar cell according to this embodiment.

In S10, a semiconductor substrate 100 is provided, and a first surface and a second surface of the semiconductor substrate 100 are textured.

In S20, a donor material film layer 600 is formed on the first surface of the semiconductor substrate 100 and/or an acceptor material film layer 700 is formed on the second surface of the semiconductor substrate.

In S30, a first passivation layer 200 is formed on a surface of the donor material film layer 600, and a first electrode layer 300 is formed on a surface of the first passivation layer 200; and/or a second passivation layer 400 is formed on a surface of the acceptor material film layer 700, and a second electrode layer 500 is formed on a surface of the second passivation layer 400, to obtain a solar cell.

The donor material may be coated on the first surface or the second surface of the semiconductor substrate 100 alone to obtain the solar cell, and the acceptor material may also be coated on the first surface or the second surface of the semiconductor substrate 100 to obtain the solar cell, so as to inhibit silicon epitaxial growth caused by contact between the semiconductor substrate 100 and the first passivation layer 200 or contact between the semiconductor substrate 100 and the second passivation layer 400. The acceptor material may be coated on the second surface or the first surface of the semiconductor substrate 100 to form the solar cell while the donor material is coated on the first surface or the second surface of the semiconductor substrate 100, which inhibits silicon epitaxial growth on the surface of the semiconductor substrate 100 at the same time through a barrier effect of the donor material and the acceptor material. The donor material and the acceptor material according to the present disclosure are rich in variety, simple in manufacturing process, and mature in technology, which can act as a barrier between a crystalline silicon interface and an amorphous silicon interface of the solar cell without expensive equipment, so as to inhibit the silicon epitaxial growth. In addition, the present disclosure can also strengthen a passivation effect, enhance the light absorption effect and improve photoelectric conversion efficiency of the solar cell through electron transport capability of the acceptor material and hole transport capability of the donor material.

The solar cell is manufactured below with an example in which the donor material film layer 600 is coated on the first surface of the semiconductor substrate 100 and the acceptor material film layer 700 is coated on the second surface of the semiconductor substrate 100. Specific manufacturing steps are as follows.

In S10, a semiconductor substrate 100 is provided, and a first surface and a second surface of the semiconductor substrate 100 are textured.

In some embodiments, a monocrystalline silicon substrate or a silicon carbide substrate is selected as the semiconductor substrate 100.

In some embodiments, the semiconductor substrate 100 may be an N-type semiconductor substrate or a P-type semiconductor substrate.

In some embodiments, the first surface and the second surface of the semiconductor substrate 100 may be textured to form a textured surface or surface texture structure (such as a pyramid structure). The texturing may be performed by chemical etching, laser etching, a mechanical process, plasma etching and so on, which is not limited herein. For example, a first surface and a second surface of a silicon substrate may be textured by a NaOH solution. Due to anisotropy of the corrosion of the NaOH solution, a pyramid-structure texture can be formed. The surface of the semiconductor substrate is textured to have a textured structure, which produces a light trapping effect and increases an amount of light incidence, so as to improve the conversion efficiency of the solar cell.

In some embodiments, prior to the texturing, a step of cleaning the semiconductor substrate 100 may be performed to remove metal and organic contaminants on its surface.

In S20, a donor material film layer 600 is formed on the textured first surface of the semiconductor substrate 100 using a donor material, and an acceptor material film layer 700 is formed on the textured second surface of the semiconductor substrate 100 using an acceptor material.

The donor material is dissolved in a first solvent, and then is coated on the first surface of the semiconductor substrate 100 by any one of spraying, pulling, spin coating, blade coating, printing and evaporation deposition. When the film layer is formed by spraying, a temperature of the substrate is controlled in a range of 50° C. to 100° C. The material is directly sprayed on the surface of the semiconductor substrate 100 through a nozzle. A distance between the nozzle and a sample is 1 cm to 8 cm, and a moving speed is 50 mm/s to 200 mm/s. When the film layer is formed by spin coating, the coating is performed in two stages. In the first stage, the coating is performed for 10 s to 20 s at a speed of 500 r/min to 1000 r/min. In the second stage, the coating is performed for 20 s to 50 s at a speed of 5000 r/min to 10000 r/min. When the film layer is formed by pulling, a pulling speed is 20 mm/min to 200 mm/min, and the time of staying in the solution is 10 s to 30 s.

The donor material is dissolved in the first solvent to form a solution with a concentration of 1 mg/mL to 50 mg/mL, which may specifically be 1 mg/mL, 5 mg/mL, 10 mg/mL, 20 mg/mL, 30 mg/mL, 40 mg/mL, 50 mg/mL or the like.

The concentration of the donor material is controlled in the above range to ensure the quality of the coating.

The first solvent may be any one of chloroform, methanol, ethanol, acetone, dichloromethane and ethyl acetate.

The donor material includes at least one of an organic acceptor material and an inorganic acceptor material with electron transport capability. For example, the organic acceptor material includes at least one of a fullerene-based acceptor material and a non-fullerene-based acceptor material. For example, the organic acceptor material may be perylene diimides, benzothiazoles, diketopyrrolopyrroles and the like. The inorganic acceptor material includes at least one of graphene, cadmium antimonide and zinc oxide. The organic and inorganic materials can be used alone or in combination, which is not limited in the present disclosure.

The acceptor material is dissolved in a second solvent, and then is coated on the second surface of the semiconductor substrate 100 by any one of pulling, spin coating, blade coating, printing and evaporation deposition.

The acceptor material is dissolved in the second solvent to form a solution with a concentration of 1 mg/mL to 50 mg/mL, which may be 1 mg/mL, 5 mg/mL, 10 mg/mL, 20 mg/mL, 30 mg/mL, 40 mg/mL, 50 mg/mL or the like. The concentration of the donor material is controlled in the above range to ensure the quality of the coating.

The second solvent may be any one of chloroform, methanol, ethanol, acetone, dichloromethane and ethyl acetate.

The donor material includes at least one of a polythiophene material with hole transport capability, a fluorene-containing polymer material, a small-molecule photovoltaic material containing a benzodithiophene electron donor element and a small-molecule photovoltaic material containing a porphyrin unit.

In S30, a first passivation layer 200 is formed on a surface of the donor material film layer 600, and a first electrode layer 300 is formed on a surface of the first passivation layer 200; and a second passivation layer 400 is formed on a surface of the acceptor material film layer 700, and a second electrode layer 500 is formed on a surface of the second passivation layer 400.

In some embodiments, the first passivation layer 200 includes one or any combination of a silicon oxide layer, a silicon nitride layer, a silicon oxynitride layer, a silicon oxycarbonitride layer and a silicon carbide layer. The first passivation layer 200 may also be other types of passivation layers. A specific material of the first passivation layer 200 is not limited in the present disclosure. The passivation layer can bring a good passivation effect on the silicon substrate and help to improve the conversion efficiency of the solar cell.

In some embodiments, the first passivation layer 200 may be deposited by plasma enhanced chemical vapor deposition, and other methods such as organic chemical vapor deposition may also be used. A specific implementation of the first passivation layer is not limited in the embodiments of the present disclosure.

In some embodiments, the second passivation layer 400 includes one or any combination of a silicon oxide layer, a silicon nitride layer, a silicon oxynitride layer, a silicon oxycarbonitride layer and a silicon carbide layer. It is appreciated that, the second passivation layer 400 may also be other types of passivation layers. A specific material of the second passivation layer 400 is not limited in the present disclosure. The passivation layer on the rear surface can bring a good passivation effect on the silicon substrate and help to improve the conversion efficiency of the solar cell.

In some embodiments, the second passivation layer 400 may be deposited by plasma enhanced chemical vapor deposition, and other methods such as organic chemical vapor deposition may also be used. A specific implementation of the second passivation layer 400 is not limited in the embodiments of the present disclosure.

In some embodiments, the first electrode layer 300 or the second electrode layer 500 includes a transparent conductive electrode material.

Figure 5:
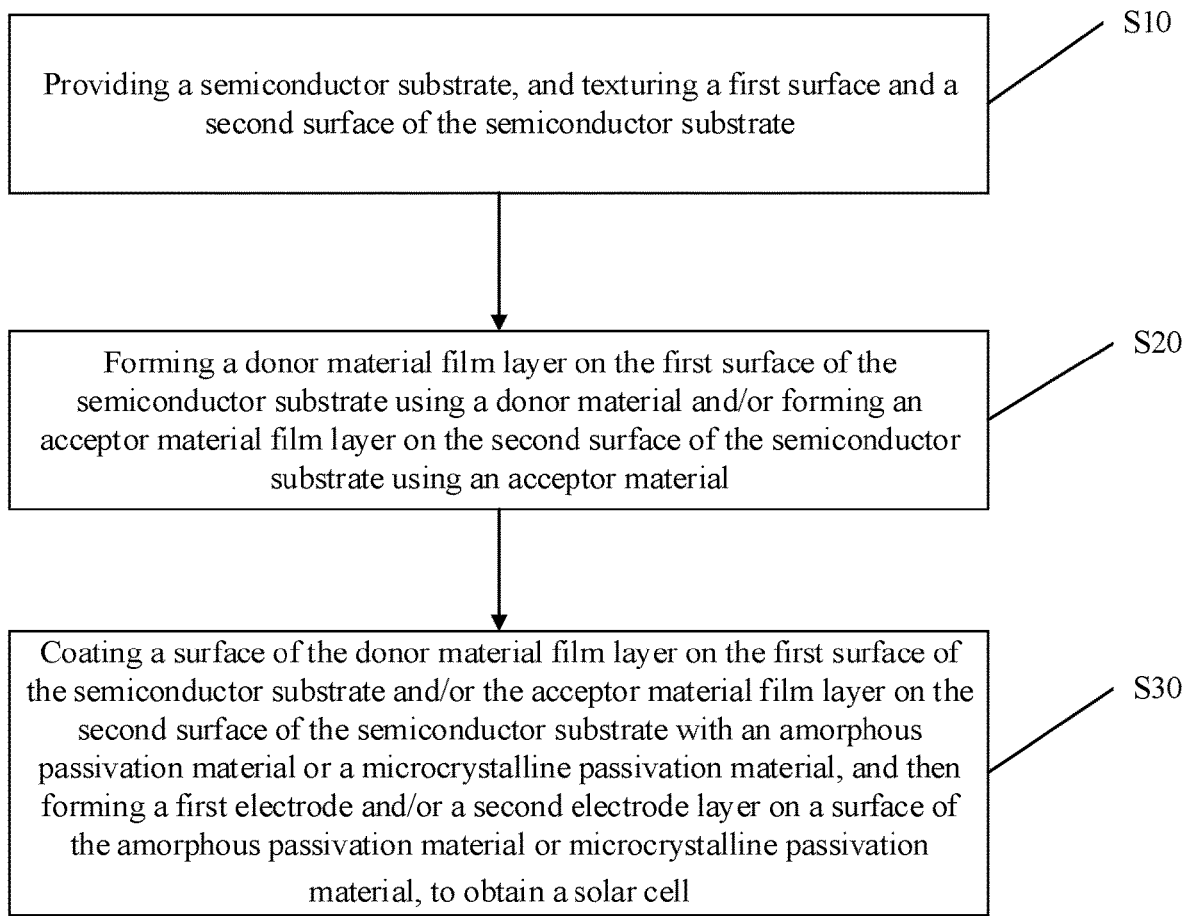
FIG. 5 is a flowchart of another manufacturing method of the solar cell according to an embodiment of the present disclosure.

FIG. 5 is a flowchart of another method for manufacturing a solar cell according to an embodiment of the present disclosure. As shown in FIG. 5, the method for manufacturing a solar cell according to the present disclosure includes the following steps.

In S10, a semiconductor substrate 100 is provided, and a first surface and a second surface of the semiconductor substrate 100 are textured.

In S20, a donor material film layer 600 is formed on the textured first surface of the semiconductor substrate 100 using a donor material, and an acceptor material film layer 700 is formed on the textured second surface of the semiconductor substrate 100 using an acceptor material.

In S30, a surface of the donor material film layer 600 on the first surface of the semiconductor substrate 100 and/or the acceptor material film layer 700 on the second surface of the semiconductor substrate 100 are/is coated with an amorphous passivation material or a microcrystalline passivation material, and then a first electrode layer 300 and/or a second electrode layer 500 are/is formed on a surface of the amorphous passivation material or microcrystalline passivation material, to obtain a solar cell.

Different from the method for manufacturing a solar cell in FIG. 4, in S30, a film layer made of an amorphous passivation material or a microcrystalline passivation material with doping elements of a same conductivity type as that in the semiconductor substrate 100 is added to the first surface, and a film layer made of an amorphous passivation material or a microcrystalline passivation material with doping elements of an opposite conductivity type to that in the semiconductor substrate 100 is added to the second surface. The amorphous passivation material or microcrystalline passivation material of the same conductivity type as that in the semiconductor substrate 100 may form a PN junction with the semiconductor substrate 100, which enhances electron transport. The amorphous passivation material or microcrystalline passivation material of the opposite conductivity type to that in the semiconductor substrate 100 is intended to form a surface electric field to reduce carrier recombination, thereby improving the conversion efficiency of the solar cell.

The film layer made of the amorphous passivation material or microcrystalline passivation material is manufactured with the following method.

At least one of amorphous silicon carbide, amorphous silicon oxide, amorphous silicon nitride and amorphous silicon germanium is deposited on the surface of the donor material film layer 600 for first annealing treatment.

At least one of amorphous silicon carbide, amorphous silicon oxide, amorphous silicon nitride and amorphous silicon germanium is deposited on the surface of the acceptor material film layer 700 for second annealing treatment.

In some embodiments, the film layer made of the amorphous passivation material or microcrystalline passivation material is manufactured by any one of plasma enhanced chemical vapor deposition (PECVD), low pressure chemical vapor deposition (LPCVD), hot wire chemical vapor deposition (HWCVD) and atomic layer deposition (ALD). A reaction gas is at least one of silane, oxygen, carbon dioxide and ammonia. In addition, the film layer made of the amorphous passivation material or microcrystalline passivation material is formed by using a silicon target, a silicon oxide target and a silicon carbide target combined with a magnetron sputtering device. The addition of the amorphous passivation material or microcrystalline passivation material to the solar cell can improve an open-circuit voltage and a fill factor of the solar cell. For example, the film layer made of the amorphous passivation material or microcrystalline passivation material is manufactured by using a tubular PECVD device. A mixture of silane and hydrogen is used as the reaction gas to be deposited at a silane flow rate of 1 sccm to 500 sccm, a hydrogen flow rate of 0 sccm to 500 sccm, a pressure of 5 mTorr to 5000 mTorr, and a temperature of 50° C. to 600° C., to obtain the film layer made of the amorphous passivation material or microcrystalline passivation material. The PECVD device has a power density of 2 $mW/cm^2$ to 2000 $mW/cm^2$ and a power frequency of 1 KHz to 100 MHz.

In some embodiments, the first annealing treatment and the second annealing treatment are performed at a temperature of 80° C. to 120° C., which may be 80° C., 90° C., 100° C., 110° C., 120° C. or the like. The time for the first annealing treatment is 5 min to 10 min, which may be 5 min, 6 min, 7 min, 8 min, 9 min, 10 min or the like. The temperature and the time of the annealing treatment are controlled in the above range in the present disclosure, which can reduce carrier recombination in the solar cell and improve photoelectric efficiency. It is appreciated that, the deposited raw material is an amorphous silicon material. With an increase in the annealing temperature and the extension of the annealing time, the amorphous silicon material is transformed into a microcrystalline material. Whether the amorphous material is transformed into the microcrystalline material depends on the annealing temperature and the annealing time. When the temperature is lower or the annealing time is shorter, a mixture of an amorphous silicon material and a microcrystalline material may be obtained after annealing treatment. It is appreciated that, the manufacturing order of the amorphous passivation material or microcrystalline passivation material and the donor material film layer 600/acceptor material film layer 700 may also be reversed, and the effect of inhibiting silicon epitaxy does not significantly change.

In some embodiments, the first passivation layer and/or the second passivation layer may be deposited by plasma enhanced chemical vapor deposition (PECVD) or low pressure chemical vapor deposition (LPCVD) or physical vapor deposition (PVD) or organic chemical deposition or other methods.

An existing silicon heterojunction solar cell is a solar cell with an intrinsic hydrogenated amorphous silicon layer disposed between a P-type amorphous silicon doped layer and a crystalline silicon substrate and between an N-type amorphous silicon doped layer and the crystalline silicon substrate. The intrinsic amorphous silicon layer is configured to passivate a doped silicon substrate. However, the intrinsic amorphous silicon layer deposited on the crystalline silicon substrate is prone to silicon epitaxial growth in an interface contact region, which affects the passivation effect, leads to a low open-circuit voltage, and then leads to low efficiency of the silicon heterojunction solar cell. Moreover, since an epitaxial layer formed on one side of the crystalline silicon substrate facing the P-type amorphous silicon doped layer is within a built-in electric field, the epitaxial layer has a great influence on the silicon heterojunction solar cell.

Figure 6:
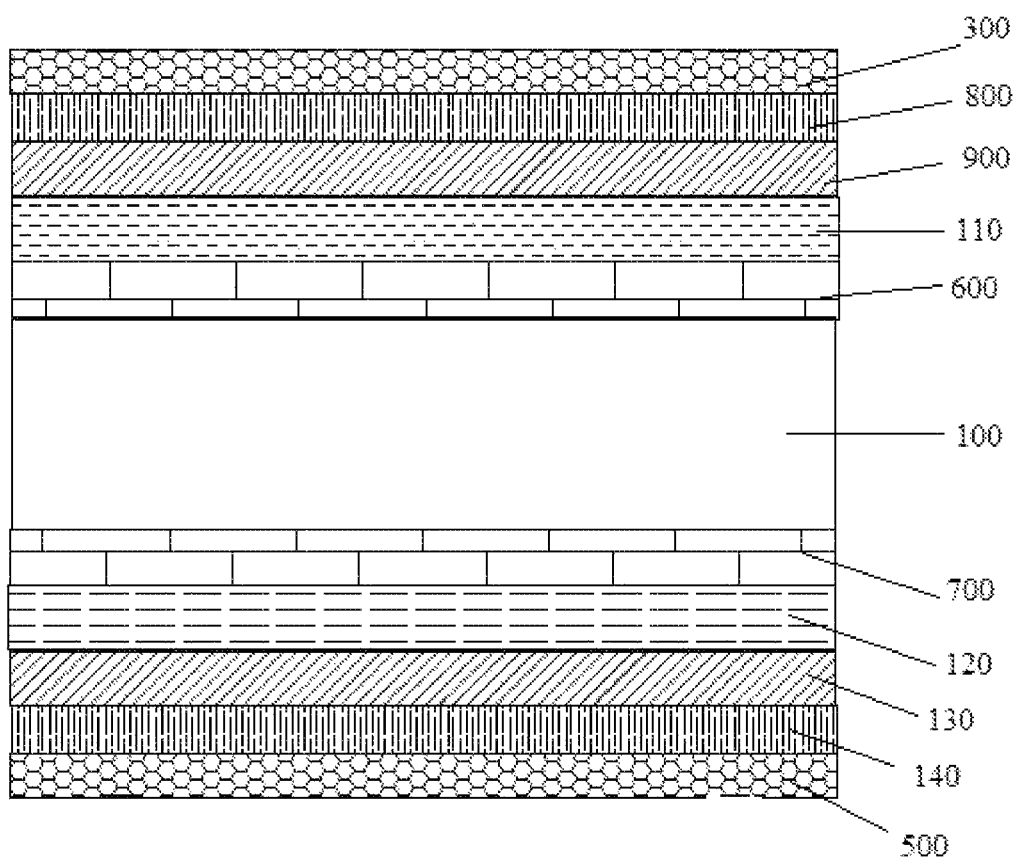
FIG. 6 is a schematic structural diagram of a heterojunction solar cell according to an embodiment of the present disclosure.
Figure 7:
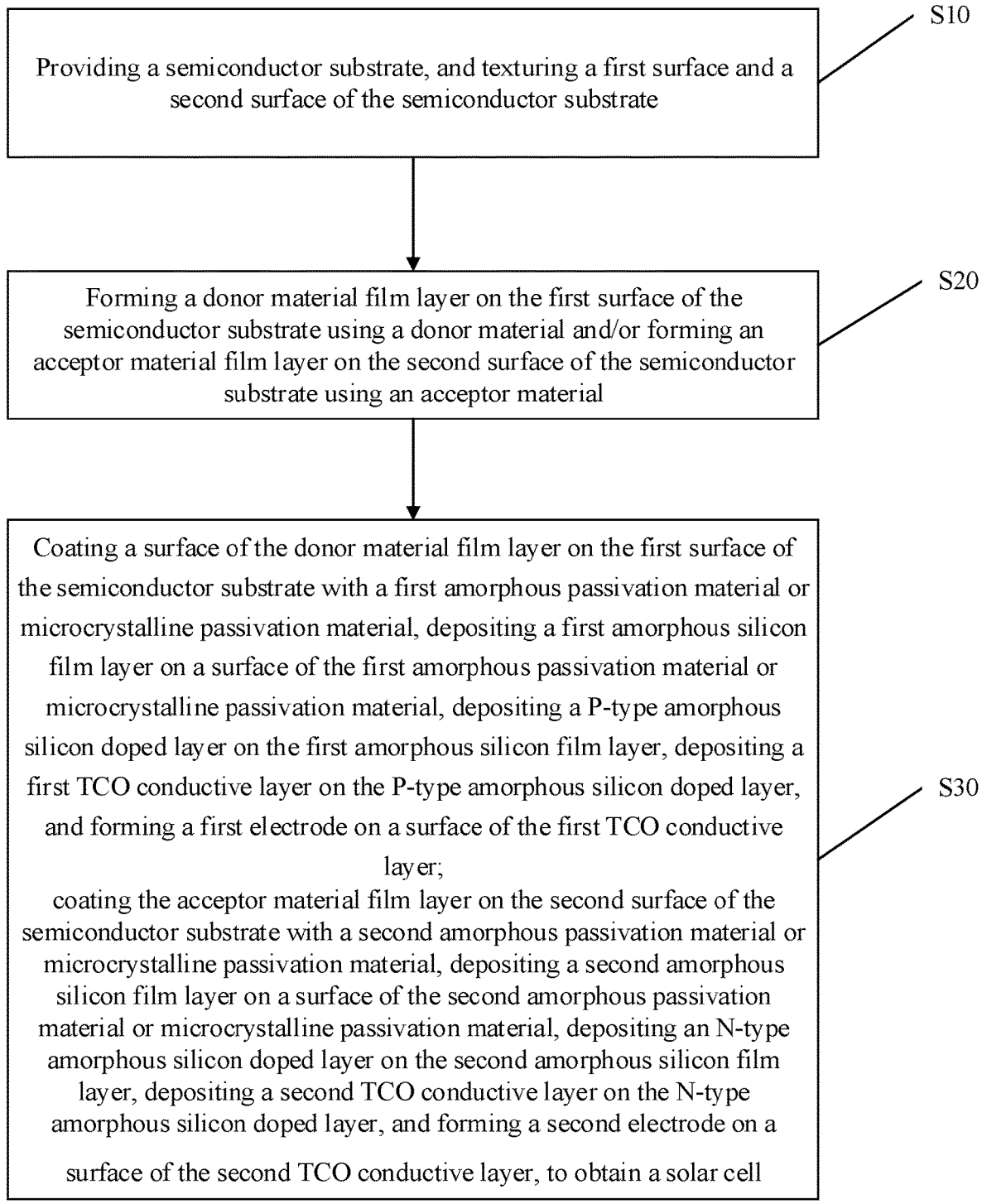
FIG. 7 is a flowchart a manufacturing method of the heterojunction solar cell according to an embodiment of the present disclosure.

An embodiment of the present disclosure further provides a solar cell. FIG. 6 is a schematic structural diagram of a heterojunction solar cell according to the present disclosure. The heterojunction solar cell includes a first electrode layer 300, a P-type amorphous silicon doped layer 800, a first amorphous silicon film layer 900, a first amorphous passivation material or microcrystalline passivation material layer 110, a donor material film layer 600, a semiconductor substrate 100, an acceptor material film layer 700, a second amorphous passivation material or microcrystalline passivation material layer 120, a second amorphous silicon film layer 130, an N-type amorphous silicon doped layer 140 and a second electrode layer 500 arranged sequentially from top to bottom. The transparent conductive material in the first electrode layer 300 and the second electrode layer 500 can reduce series resistance during current collection, and can also reduce reflection. FIG. 7 is a manufacturing flowchart of the heterojunction solar cell according to the present disclosure. The heterojunction solar cell is manufactured through the following steps.

In S10, a semiconductor substrate 100 is provided, and a first surface and a second surface of the semiconductor substrate 100 are textured.

In S20, a donor material film layer 600 is formed on the textured first surface of the semiconductor substrate 100 using a donor material, and an acceptor material film layer 700 is formed on the textured second surface of the semiconductor substrate 100 using an acceptor material.

In S30, a surface of the donor material film layer 600 on the first surface of the semiconductor substrate 100 is coated with an amorphous passivation material or a microcrystalline passivation material to form a first amorphous passivation material or microcrystalline passivation material layer 110, a first amorphous silicon film layer 900 is deposited on the surface of the first amorphous passivation material or microcrystalline passivation material layer 110, a P-type amorphous silicon doped layer 800 is deposited on the first amorphous silicon film layer 900, and a first electrode layer 300 is deposited on the P-type amorphous silicon doped layer 800.

The acceptor material film layer 700 on the second surface of the semiconductor substrate 100 is coated with an amorphous passivation material or a microcrystalline passivation material to form a second amorphous passivation material or microcrystalline passivation material layer 120, a second amorphous silicon film layer 130 is deposited on the surface of the second amorphous passivation material or microcrystalline passivation material layer 120, an N-type amorphous silicon doped layer 140 is deposited on the second amorphous silicon film layer 130, and a second electrode layer 500 is deposited on the N-type amorphous silicon doped layer 140, to obtain the solar cell.

In the above technical solution, mismatch of valence bands may cause a large potential barrier to the holes, thereby affecting transport of the holes. Therefore, the donor material film layer 600 and the acceptor material film layer 700 are arranged on surfaces where the semiconductor substrate 100 contacts with the first amorphous silicon layer 900 and the semiconductor substrate 100 contacts with the second amorphous silicon layer 130, so as to inhibit silicon epitaxial growth between the silicon substrate and the amorphous silicon interface, which can also reduce valence band compensation at an interface on one side of the semiconductor substrate 100 facing the amorphous silicon layer, increase the hole transport and improve the fill actor of the silicon heterojunction cell, thereby improving the efficiency of the heterojunction cell.

In some embodiments, the first amorphous silicon layer 900 and the second amorphous silicon layer 130 may be deposited by any one of plasma enhanced chemical vapor deposition, plasma chemical vapor deposition and reactive ion deposition. Plasma enhanced chemical vapor deposition (PECVD) is preferred. A PECVD radio frequency is 13.56 MHZ, a base pressure of a working chamber is $2*10^{-4}$ Pa, a radio frequency power density is 0.05 $W/cm^{-3}$ to 0.5 $W/cm^{-3}$, electron grade silane and hydrogen are used as growth sources, a flow ratio of silane to hydrogen is 1:5 to 1:15, working pressure is 10 Pa to 200 Pa, a growth temperature is 100° C. to 300° C., and the grown amorphous silicon film layer has a film thickness of 5 nm to 20 nm.

In some embodiments, the P-type amorphous silicon doped layer 800 and the N-type amorphous silicon doped layer 140 may be formed by chemical vapor deposition (CVD), physical vapor deposition (PVD) or atomic layer deposition (ALD).

A doping process may also be performed by any one or more of high temperature diffusion, slurry doping and ion implantation. A doping element of the P-type amorphous silicon doped layer 800 may be a Group 3 element such as boron, gallium or indium. The semiconductor substrate is placed in a tubular diffusion furnace, a boron tribromide liquid source is used as a diffusion source (or doping source), and a constant temperature zone is maintained at a temperature of about 850° C. The doped layer is formed by boron diffusion on the semiconductor substrate for a certain diffusion time (for example, 40 min) and at a doping junction depth of 0.2 μm to 1.0 μm. A doping element of the N-type amorphous silicon doped layer 140 may be a Group 5 element such as phosphorus or arsenic.

The first amorphous silicon film layer 900 and the P-type amorphous silicon doped layer 800 play a role of passivating the semiconductor substrate 100, resulting in a higher open-circuit voltage, which reduces the recombination rate of an electrode surface.

In some embodiments, the first amorphous passivation material or microcrystalline passivation material layer may be at least one of an oxide, a nitride, a doped oxide and a mixed oxide. Specifically, the oxide may be $In_2O_3$, $SnO_2$, ZnO or CdO, the nitride may be TiN, and the doped oxide may be $In_2O_3$: Sn, ZnO:In, ZnO:Ga, ZnO:Al, $SnO_2$:F or $SnO_2$:Ta. The mixed oxide may be $In_2O_3$—ZnO, Cd $In_2O_4$, $Cd_2SnO_4$ or $Zn_2SnO_4$.

The material layer may be formed by a reactive plasma deposition (RPD) process, a photochemical deposition (PCD) process or a physical vapor deposition (PVD) process. Preferably, an electrode film layer is deposited by the PCD process. A sputtering target may be any one of tin-doped $In_2O_3$ (ITO), tungsten-doped indium oxide (IWO) and fluorine-doped tin oxide (FTO). Purity of the sputtering target is 99.999%, a base pressure of sputtering is $5*10^{-4}$ Pa, a working gas is argon (with purity of 99.99%), a working pressure is 0.5 Pa to 2 Pa, sputtering power is 30 W to 200 W, and a substrate temperature is in a range of 100° C. to 200° C. In addition, in order to obtain an electrode layer with high conductivity, high-purity oxygen (with purity of 99.999%) is often introduced during the sputtering, and a flow ratio of argon to oxygen is 20:1 to 100:1.

Thicknesses of the first electrode layer 300 and the second electrode layer 500 are each 50 nm to 200 nm, which may be 50 nm, 80 nm, 100 nm, 150 nm, 200 nm or the like.

In a third aspect, the present disclosure provides a photovoltaic module. The photovoltaic module includes a plurality of solar cell strings. Each of the solar cell strings includes a plurality of solar cells connected by a conductive band. The solar cell may be the solar cell above (e.g., the solar cell illustrated in FIGS. 1-3 and 6) or a solar cell manufactured by the manufacturing method (e.g., the manufacturing method illustrated in FIGS. 4-5 and 7).

Embodiment 1

In S10, front and rear surfaces of an N-type monocrystalline silicon wafer are textured with alkali to form a pyramidal texture.

In S20, poly(3-octylthiophene) is dissolved in chloroform to form a solution with a concentration of 25 mg/mL, first spin coating is performed on the solution by a spin coating machine at a speed of 500 r/min for 15 s, and second spin coating is performed then at a speed of 5000 r/min for 30 s to obtain a donor material film layer (cadmium antimonide) dissolved in chloroform to form a solution with a concentration of 25 mg/mL; first spin coating is performed on the solution by the spin coating machine at a speed of 500 r/min for 15 s, and second spin coating is performed then at a speed of 5000 r/min for 30 s to obtain an acceptor material film layer. A thickness of the donor material film layer is 10 nm, and a thickness of the acceptor material film layer is 10 nm.

In S30, an intrinsic hydrogenated nano-silicon film layer and a P-type hydrogenated nano-silicon film layer are sequentially deposited on a surface of the donor material film layer by PECVD, an intrinsic hydrogenated nano-silicon film layer and an N-type hydrogenated nano-silicon film layer are sequentially deposited on a surface of the acceptor material film layer by PECVD, and transparent conductive films are sputtered on surfaces of the P-type hydrogenated nano-silicon film layer and the N-type hydrogenated nano-silicon film layer respectively, to obtain a solar cell.

Embodiment 2

Different from Embodiment 1, the thickness of the donor material film layer is 0.5 nm, and the thickness of the acceptor material film layer is 0.5 nm.

Embodiment 3

Different from Embodiment 1, the thickness of the donor material film layer is 1 nm, and the thickness of the acceptor material film layer is 1 nm.

Embodiment 4

Different from Embodiment 1, the thickness of the donor material film layer is 5 nm, and the thickness of the acceptor material film layer is 5 nm.

Embodiment 5

Different from Embodiment 1, the thickness of the donor material film layer is 15 nm, and the thickness of the acceptor material film layer is 15 nm.

Embodiment 6

Different from Embodiment 1, the thickness of the donor material film layer is 20 nm, and the thickness of the acceptor material film layer is 20 nm.

Embodiment 7

Different from Embodiment 1, the thickness of the donor material film layer is 22 nm, and the thickness of the acceptor material film layer is 22 nm.

Embodiment 8

In S10, front and rear surfaces of an N-type monocrystalline silicon wafer are textured with alkali to form a pyramidal texture.

In S20, poly(3-octylthiophene) is dissolved in chloroform to form a solution with a concentration of 25 mg/mL, first spin coating is performed on the solution by a spin coating machine at a speed of 500 r/min for 15 s, and second spin coating is performed then at a speed of 5000 r/min for 30 s to obtain a donor material film layer (cadmium antimonide) dissolved in chloroform to form a solution with a concentration of 25 mg/mL; first spin coating is performed on the solution by the spin coating machine at a speed of 500 r/min for 15 s, and second spin coating is performed then at a speed of 5000 r/min for 30 s to obtain an acceptor material film layer. A thickness of the donor material film layer is 10 nm, and a thickness of the acceptor material film layer is 10 nm.

In S30, amorphous silicon oxide is deposited on a surface of the acceptor material film layer and a surface of the donor material film layer by a tubular PECVD device; a mixture of silane and hydrogen is used as the reaction gas to be deposited at a silane flow rate of 200 sccm, a hydrogen flow rate of 200 sccm, a pressure of 1000 mTorr, and a temperature of 1000° C., to obtain an amorphous passivation material or microcrystalline passivation material film layers on front and rear surfaces.

In S40, an intrinsic hydrogenated nano-silicon film layer and a P-type hydrogenated nano-silicon film layer are sequentially deposited on a surface of the amorphous passivation material or microcrystalline passivation material film layer on the front surface by PECVD, an intrinsic hydrogenated nano-silicon film layer and an N-type hydrogenated nano-silicon film layer are sequentially deposited on a surface of the amorphous passivation material or microcrystalline passivation material film layer on the rear surface by PECVD, and transparent conductive films are sputtered on surfaces of the P-type hydrogenated nano-silicon film layer and the N-type hydrogenated nano-silicon film layer respectively, to obtain a solar cell.

Comparative Example 1

Different from Embodiment 1, S20 is skipped, and the solar cell is manufactured directly through S10 and S30.

Performance tests of Embodiments 1 to 8 and Comparative Example 1 are shown in Table 1 below.

TABLE 1

Performance tests of Embodiments 1 to 8 and Comparative Example 1

| Group | Thickness of donor material film layer (nm) | Thickness of acceptor material film layer (nm) | Thickness of first passivation layer (nm) | Thickness of second passivation layer (nm) | Open-circuit voltage (V) | Short-circuit current density (mA/cm$^2$) | Fill factor (%) | Conversion efficiency (%) |
|---|---|---|---|---|---|---|---|---|
| Embodiment 1 | 10 | 10 | 30 | 30 | 0.738 | 38.247 | 82.54 | 23.30 |
| Embodiment 2 | 0.5 | 0.5 | 40 | 40 | 0.732 | 38.251 | 82.61 | 23.13 |
| Embodiment 3 | 1 | 1 | 35 | 35 | 0.733 | 38.248 | 82.55 | 23.14 |
| Embodiment 4 | 5 | 5 | 35 | 35 | 0.741 | 38.257 | 82.53 | 23.39 |
| Embodiment 5 | 15 | 15 | 30 | 30 | 0.735 | 38.205 | 82.35 | 23.12 |
| Embodiment 6 | 20 | 20 | 25 | 25 | 0.736 | 38.207 | 82.28 | 23.14 |
| Embodiment 7 | 22 | 22 | 25 | 25 | 0.733 | 38.108 | 82.15 | 22.94 |
| Embodiment 8 | 10 | 10 | 30 | 30 | 0.742 | 38.261 | 82.63 | 23.45 |
| Comparative Example 1 | / | / | / | / | 0.725 | 38.184 | 81.78 | 22.64 |

It can be known from Table 1, with reference to Embodiment 1 to Embodiment 7, the greater the thickness of the donor material film layer 600 and the acceptor material film layer 700, the greater the open-circuit voltage, which gradually improves the conversion efficiency of the solar cell. As shown in Embodiment 2, the thicknesses of the donor material film layer 600 and the acceptor material film layer 700 is less than the range limited by the present disclosure. As a result, its capability to inhibit silicon epitaxial growth is weakened, and its electron transport capability and hole transport capability may also be reduced, thereby reducing the conversion efficiency of the solar cell. As shown in Embodiment 7, the thicknesses of the donor material film layer 600 and the acceptor material film layer 700 is greater than the range limited by the present disclosure, and carrier transport capability of the solar cell deteriorates; as a result, the short-circuit current density and the fill factor decrease, and then the efficiency of the solar cell becomes low.

As shown in Embodiment 8, the amorphous passivation material or microcrystalline passivation material with doping elements of the same conductivity type as that in the semiconductor substrate 100 is deposited between the semiconductor substrate 100 and the donor material film layer 600. The amorphous passivation material or microcrystalline passivation material may form a tunneling emission junction with the semiconductor substrate to enhance electron transport. The amorphous passivation material or microcrystalline passivation material with doping elements of the opposite conductivity type as to that in the semiconductor substrate 100 is deposited between the semiconductor substrate 100 and the acceptor material film layer 700. The amorphous passivation material or microcrystalline passivation material forms a surface electric field to reduce carrier recombination, which can effectively improve the open-circuit voltage and the fill factor of the solar cell, so as to improve the conversion efficiency of the solar cell.

In Comparative Example 1, none of donor material film layer or acceptor material film layer is disposed. As a result, silicon epitaxial growth is easy to occur between a crystalline silicon interface and an amorphous silicon interface, which makes the open-circuit voltage, the short-circuit current and the fill factor of the manufactured solar cell smaller, and ultimately leads to low conversion efficiency of the solar cell.

The above are only preferred embodiments of the present disclosure and are not intended to limit the present disclosure. For those skilled in the art, the present disclosure may have various modifications and variations. Any modifications, equivalent substitutions, improvements and the like made within the spirit and principle of the present disclosure should fall within the protection scope of the present disclosure.

The present disclosure is described above with preferred embodiments, but these embodiments are not intended to limit the present disclosure. Any person skilled in the art can make possible variations and modifications without departing from the conception of the present disclosure. Therefore, the protection scope of the present disclosure should subject to the scope defined by the appended claims of the present disclosure.

What is claimed is:

1. A solar cell, comprising:
   a semiconductor substrate having a first surface and a second surface opposite to the first surface;
   a first passivation layer and a first electrode layer that are located on the first surface of the semiconductor substrate; and
   a second passivation layer and a second electrode layer that are located on the second surface of the semiconductor substrate,
   wherein a donor material film layer is provided between the first passivation layer and the first surface of the semiconductor substrate, and an acceptor material film layer is provided between the second passivation layer and the second surface of the semiconductor substrate,
   wherein an acceptor material of the acceptor material film layer has an electron mobility of 1 $cm^2V^{-1}S^{-1}$ to 50 $cm^2V^{-1}S^{-1}$, a lowest unoccupied molecular orbital (LUMO) energy level of −2.8 eV to −3.6 eV, a highest occupied molecular orbital (HOMO) energy level of −5.2 eV to −5.6 eV, and an optical band gap of 1.7 eV to 4 eV,
   wherein a donor material of the donor material film layer has a hole mobility of $1\times10^{-6}$ $cm^2V^{-1}S^{-1}$ to $1\times10^{-2}$ $cm^2V^{-1}S^{-1}$, a LUMO energy level of −3.2 eV to −3.6 eV, a HOMO energy level of −5.2 eV to −6.4 eV, and an optical band gap of 1.7 eV to 4 eV,
   wherein the acceptor material film layer comprises an organic acceptor material having electron transport capability, and the organic acceptor material comprises at least one of a fullerene-based acceptor material and a non-fullerene-based acceptor material, and
   wherein the donor material film layer comprises at least one of a polythiophene material having hole transport capability, a fluorene-containing polymer material, a small-molecule photovoltaic material containing a benzodithiophene electron donor element and a small-molecule photovoltaic material containing a porphyrin unit.

2. The solar cell according to claim 1, wherein the donor material film layer has a thickness of 1 nm to 20 nm, and/or the acceptor material film layer has a thickness of 1 nm to 20 nm.

3. The solar cell according to claim 1, wherein the semiconductor substrate comprises a monocrystalline silicon substrate or a silicon carbide substrate.

4. The solar cell according to claim 1, wherein the semiconductor substrate is an N-type semiconductor substrate, and the donor material film layer is arranged between a first surface of the N-type semiconductor substrate and the first passivation layer; or
   the semiconductor substrate is a P-type semiconductor substrate, and the acceptor material film layer is arranged between a first surface of the P-type semiconductor substrate and the first passivation layer.

5. The solar cell according to claim 1, wherein the first passivation layer comprises an amorphous passivation material or a microcrystalline passivation material having doping elements of a same conductivity type as in the semiconductor substrate.

6. The solar cell according to claim 5, wherein the semiconductor substrate is an N-type semiconductor substrate, and the first passivation layer comprises an N-type doped amorphous silicon material or microcrystalline silicon material; or
   the semiconductor substrate is a P-type semiconductor substrate, and the first passivation layer comprises a P-type doped amorphous silicon material or microcrystalline silicon material.

7. The solar cell according to claim 1, wherein the first electrode layer or the second electrode layer comprises a transparent conductive electrode material.

8. The solar cell according to claim 1, wherein the second passivation layer comprises an amorphous passivation material or a microcrystalline passivation material having doping elements of an opposite conductivity type as in the semiconductor substrate.

9. The solar cell according to claim 8, wherein the semiconductor substrate is an N-type semiconductor substrate, and the second passivation layer comprises a P-type doped amorphous silicon material or microcrystalline silicon material; or
   the semiconductor substrate is a P-type semiconductor substrate, and the second passivation layer comprises an N-type doped amorphous silicon material or microcrystalline silicon material.

10. A method for manufacturing a solar cell, comprising:
    providing a semiconductor substrate;
    forming a donor material film layer on a first surface of the semiconductor substrate; and forming a first passivation layer on a surface of the donor material film layer, and forming a first electrode layer on a surface of the first passivation layer; and
    forming an acceptor material film layer on a second surface of the semiconductor substrate; and forming a second passivation layer on a surface of the acceptor material film layer, and forming a second electrode layer on a surface of the second passivation layer,
    wherein an acceptor material of the acceptor material film layer has an electron mobility of 1 $cm^2V^{-1}S^{-1}$ to 50 $cm^2V^{-1}S^{-1}$, a lowest unoccupied molecular orbital (LUMO) energy level of −2.8 eV to −3.6 eV, a highest occupied molecular orbital (HOMO) energy level of −5.2 eV to −5.6 eV, and an optical band gap of 1.7 eV to 4 eV,
    wherein a donor material of the donor material film layer has a hole mobility of $1\times10^{-6}$ $cm^2V^{-1}S^{-1}$ to $1\times10^{-2}$ $cm^2V^{-1}S^{-1}$, a LUMO energy level of −3.2 eV to −3.6 eV, a HOMO energy level of −5.2 eV to −6.4 eV, and an optical band gap of 1.7 eV to 4 eV, wherein the acceptor material film layer comprises an organic acceptor material having electron transport capability, and the organic acceptor material comprises at least one of a fullerene-based acceptor material and a non-fullerene-based acceptor material, and wherein the donor material film layer comprises at least one of a polythiophene material having hole transport capability, a fluorene-containing polymer material, a small-molecule photovoltaic material containing a benzodithiophene electron donor element and a small-molecule photovoltaic material containing a porphyrin unit.

11. The method according to claim 10, wherein the acceptor material comprises at least one of:
  a. at least one of an organic acceptor material and an inorganic acceptor material having electron transport capability;
  b. at least one of an organic acceptor material and an inorganic acceptor material having electron transport capability, the organic acceptor material comprising at least one of a fullerene-based acceptor material and a non-fullerene-based acceptor material; and
  c. at least one of an organic acceptor material and an inorganic acceptor material with electron transport capability, the inorganic acceptor material comprising at least one of graphene, cadmium antimonide and zinc oxide.

12. The method according to claim 10, wherein the donor material film layer and/or the acceptor material film layer is manufactured by:
  dissolving the donor material in a first solvent, and then coating the first surface of the semiconductor substrate with the donor material by any one of pulling, spin coating, blade coating, printing and evaporation deposition, the donor material being dissolved in the first solvent to form a solution with a concentration of 1 mg/mL to 50 mg/ml; and/or
  dissolving the acceptor material in a second solvent, and then coating the second surface of the semiconductor substrate with the acceptor material by any one of pulling, spin coating, blade coating, printing and evaporation deposition, the acceptor material being dissolved in the second solvent to form a solution with a concentration of 1 mg/ml to 50 mg/mL;
  wherein the first solvent and/or the second solvent is any one of chloroform, methanol, ethanol, acetone, dichloromethane and ethyl acetate.

13. The method according to claim 10, wherein the forming a first passivation layer on a surface of the donor material film layer and/or the forming a second passivation layer on a surface of the acceptor material film layer comprises:
  depositing at least one of amorphous silicon carbide, amorphous silicon oxide, amorphous silicon nitride and amorphous silicon germanium on the surface of the donor material film layer to obtain the first passivation layer by a first annealing treatment; and/or
  depositing at least one of amorphous silicon carbide, amorphous silicon oxide, depositing at least one of amorphous silicon carbide, amorphous silicon oxide, amorphous silicon nitride and amorphous silicon germanium on the surface of the acceptor material film layer to obtain the second passivation layer by a second annealing treatment;
  wherein the first annealing treatment and/or the second annealing treatment is performed at a temperature of 80° C. to 120° C. with an annealing treatment time of 5 min to 10 min.

14. A photovoltaic module, comprising a plurality of solar cell strings, wherein each of the solar cell strings includes a plurality of solar cells, and each of the plurality of solar cells comprises:
  a semiconductor substrate having a first surface and a second surface opposite to the first surface;
  a first passivation layer and a first electrode layer that are located on the first surface of the semiconductor substrate; and
  a second passivation layer and a second electrode layer that are located on the second surface of the semiconductor substrate,
  wherein a donor material film layer is provided between the first passivation layer and the first surface of the semiconductor substrate, and an acceptor material film layer is provided between the second passivation layer and the second surface of the semiconductor substrate,
  wherein an acceptor material of the acceptor material film layer has an electron mobility of 1 $cm^2V^{-1}S^{-1}$ to 50 $cm^2V^{-1}S^{-1}$, a lowest unoccupied molecular orbital (LUMO) energy level of −2.8 eV to −3.6 eV, a highest occupied molecular orbital (HOMO) energy level of −5.2 eV to −5.6 eV, and an optical band gap of 1.7 eV to 4 eV,
  wherein a donor material of the donor material film layer has a hole mobility of $1\times10^{-6}$ $cm^2V^{-1}S^{-1}$ to $1\times10^{-2}$ $cm^2V^{-1}S^{-1}$, a LUMO energy level of −3.2 eV to −3.6 eV, a HOMO energy level of −5.2 eV to −6.4 eV, and an optical band gap of 1.7 eV to 4 eV,
  wherein the acceptor material film layer comprises an organic acceptor material having electron transport capability, and the organic acceptor material comprises at least one of a fullerene-based acceptor material and a non-fullerene-based acceptor material, and
  wherein the donor material film layer comprises at least one of a polythiophene material having hole transport capability, a fluorene-containing polymer material, a small-molecule photovoltaic material containing a benzodithiophene electron donor element and a small-molecule photovoltaic material containing a porphyrin unit.

* * * * *